US009543151B2

(12) United States Patent
Lee et al.

(10) Patent No.: US 9,543,151 B2
(45) Date of Patent: Jan. 10, 2017

(54) IONIZER AND SUBSTRATE TRANSFER SYSTEM HAVING THE SAME, AND METHOD OF MANUFACTURING A SEMICONDUCTOR DEVICE USING THE SAME

(71) Applicants: Jae-Wook Lee, Hwaseong-si (KR); Ho-Hyung Jung, Hwaseong-si (KR)

(72) Inventors: Jae-Wook Lee, Hwaseong-si (KR); Ho-Hyung Jung, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 34 days.

(21) Appl. No.: 14/730,239

(22) Filed: Jun. 4, 2015

(65) Prior Publication Data

US 2016/0056062 A1 Feb. 25, 2016

(30) Foreign Application Priority Data

Aug. 20, 2014 (KR) ........................ 10-2014-0108586

(51) Int. Cl.
| | | |
|---|---|---|
| *H01L 21/469* | (2006.01) | |
| *H01L 21/26* | (2006.01) | |
| *H01T 19/04* | (2006.01) | |
| *H01T 23/00* | (2006.01) | |
| *H01L 21/68* | (2006.01) | |

(52) U.S. Cl.
CPC .............. *H01L 21/26* (2013.01); *H01L 21/68* (2013.01); *H01T 19/04* (2013.01); *H01T 23/00* (2013.01)

(58) Field of Classification Search
CPC ..... H01L 21/67115; H01L 21/68; H01L 21/26
USPC ........................................................ 438/798
See application file for complete search history.

(56) References Cited

U.S. PATENT DOCUMENTS

| | | | |
|---|---|---|---|
| 6,349,668 B1* | 2/2002 | Sun ........................ | B05B 5/00 |
| | | | 118/723 E |
| 2005/0116167 A1 | 6/2005 | Izaki et al. | |
| 2006/0267156 A1* | 11/2006 | Meagley ............... | B05B 5/0255 |
| | | | 257/632 |
| 2007/0006478 A1 | 1/2007 | Kotsuji | |

(Continued)

FOREIGN PATENT DOCUMENTS

| | | | |
|---|---|---|---|
| JP | 4540043 B2 | 9/2010 | |
| JP | 4573631 B2 | 11/2010 | |

(Continued)

*Primary Examiner* — Jami M Valentine
(74) *Attorney, Agent, or Firm* — Muir Patent Law, PLLC

(57) ABSTRACT

An ionizer includes a body extending in a first direction, a sheath gas nozzle installed in a lower portion of the body and having a spray hole and an electrode needle disposed within the spray hole to generate a corona discharge, a gas supply provided in the body and configured to be in fluid communication with the spray hole to supply a gas to the spray hole such that ions generated by the electrode needle are spayed out to the outside of the ionizer from the spray hole, and a pair of first and second guiding plates disposed at opposite sides of the sheath gas nozzle and extending downward from first and second sides of the body opposite to each other to guide the ions sprayed from the spray hole to be directed to a target. A semiconductor device may be manufactured using the ionizer.

20 Claims, 12 Drawing Sheets

(56) References Cited

U.S. PATENT DOCUMENTS

| | | |
|---|---|---|
| 2007/0159762 A1 | 7/2007 | Okano |
| 2009/0168287 A1 | 7/2009 | Fukai et al. |
| 2009/0168289 A1 | 7/2009 | Shimada et al. |
| 2014/0070089 A1 | 3/2014 | Otsuka |
| 2014/0070093 A1 | 3/2014 | Otsuka |

FOREIGN PATENT DOCUMENTS

| | | |
|---|---|---|
| JP | 4636710 B2 | 2/2011 |
| JP | 2011-258731 A | 12/2011 |
| JP | 4919908 B2 | 4/2012 |
| KR | 10-1048589 B1 | 7/2011 |
| KR | 10-1273720 B1 | 6/2013 |
| KR | 10-1283150 B1 | 7/2013 |

* cited by examiner

10

IONIZER AND SUBSTRATE TRANSFER SYSTEM HAVING THE SAME, AND METHOD OF MANUFACTURING A SEMICONDUCTOR DEVICE USING THE SAME

PRIORITY STATEMENT

This application claims priority under 35 U.S.C. §119 to Korean Patent Application No. 10-2014-0108586, filed on Aug. 20, 2014 in the Korean Intellectual Property Office (KIPO), the contents of which are herein incorporated by reference in their entirety.

BACKGROUND

1. Field

The present disclosure relates to an ionizer and a substrate transfer system, and a method of manufacturing a semiconductor device using the same. More particularly, example embodiments relate to an ionizer for eliminating or reducing static electricity of a wafer during a semiconductor manufacturing process, and a substrate transfer system having the same.

2. Description of the Related Art

An electrostatic charge generation on a wafer may be a potential risk factor in semiconductor fabrication processes. A DC type or AC type ionizer may be installed in a wafer transfer chamber for transferring a wafer to a process equipment to eliminate static electricity of the wafer.

However, ions generated from the ionizer may be lost due to a ground electrode adjacent to a spray hole of the ionizer, an external air current in the wafer transfer chamber, a target antistatic distance, etc., before reaching the target, to thereby deteriorate antistatic efficiency of the ionizer.

SUMMARY

Example embodiments provide an ionizer capable of improving an antistatic efficiency.

Example embodiments provide a substrate transfer system including the ionizer.

Example embodiments provide a method of manufacturing a semiconductor device using an ionizer capable of improving an antistatic efficiency and a substrate transfer system including the ionizer.

According to example embodiments, an ionizer includes a body extending in a first direction, a sheath gas nozzle installed in a lower portion of the body and having a spray hole and an electrode needle disposed within the spray hole to generate a corona discharge, a gas supply provided in the body and configured to be in fluid communication with the spray hole to supply a gas to the spray hole such that ions generated by the electrode needle are spayed out to the outside of the ionizer from the spray hole, and a pair of first and second guiding plates disposed at opposite sides of the sheath gas nozzle and extending downward from first and second sides of the body opposite to each other to guide the ions sprayed from the spray hole to be directed to a target.

In example embodiments, a plurality of the sheath gas nozzles may be arranged in the first direction.

In example embodiments, the sheath gas nozzle may be detachably installed in the lower portion of the body.

In example embodiments, a distal portion of the electrode needle may be positioned to protrude from a bottom surface of the body.

In example embodiments, fixing grooves may be formed in the first and second sides of the body respectively, and each of the first and second guiding plates has a protrusion which is shaped to be slidably fitted into the corresponding fixing groove by a sliding fitting method.

In example embodiments, the first and second guiding plates may be adhered to the first and second sides of the body by an adhesive tape respectively.

In example embodiments, the first and second guiding plates may include a non-electrostatic insulating material.

In example embodiments, a length of each of the first and second guiding plates protruding from a bottom surface of the body may be at least half of a target antistatic distance.

In example embodiments, the electrode needle may include silicon or tungsten.

According to example embodiments, a method of manufacturing a semiconductor device includes providing a substrate to a transfer chamber of a transfer apparatus, moving the substrate in the transfer chamber, and while moving the substrate in the transfer chamber, spraying ionized gas toward the substrate using an ionizer. The ionizer may include a body having a gas supply chamber for supplying gas, an ion spraying cap installed in a lower portion of the body and having a spray hole in fluid communication with the gas supply to spray a gas supplied from the gas supply to the outside of the ionizer and an electrode needle disposed within the spray hole to generate a corona discharge and generate ionized gas, and a pair of first and second guiding plate portions disposed on opposite sides of the ion spraying cap and extending downward from the lower portion of the body respectively to guide the ionized gas sprayed from the spray hole to be directed toward the substrate. The method may further include transferring the substrate to a process chamber, performing a fabrication process on the substrate while it is in the process chamber, and forming a semiconductor device from the processed substrate. The ion spraying cap may be detachably installed in a lower portion of the body.

The fabrication process may be a chemical vapor deposition process, an etching process, or a measuring process, and forming the semiconductor device may include forming a semiconductor chip including an integrated circuit on a die.

In example embodiments, the body may extend in a first direction and a plurality of the ion spraying caps may be arranged to be spaced apart from each other in the first direction.

In example embodiments, a distal portion of the electrode needle may be positioned to protrude from a bottom surface of the body.

In example embodiments, fixing grooves may be formed in first and second sides of the body opposite to each other respectively, and each of the first and second guiding plate portions may have a protrusion which is slidably fitted into the corresponding fixing groove by a sliding fitting method.

In example embodiments, the first and second guiding plate portions may be adhered to first and second sides of the body opposite to each other by an adhesive tape respectively.

In example embodiments, the first and second guiding plate portions may include a non-electrostatic insulating material.

In example embodiments, a length of each of the first and second guiding plate portions protruding from a bottom surface of the body may be at least half of a target antistatic distance.

In example embodiments, the first and second guiding plate portions may be arranged to be parallel with each other.

In example embodiments, the electrode needle may include silicon or tungsten.

In example embodiments, the gas may comprise a nitrogen gas.

According to further aspects, a method includes transferring a substrate from a substrate transfer chamber to a process chamber, the transfer chamber having a transfer device that transfers the substrate; and while the substrate is in the substrate transfer chamber: supplying gas to an ionizer disposed within the substrate transfer chamber. The ionizer may include: a body installed over the substrate, a plurality of gas nozzles installed in a lower portion of the body and arranged in a first direction, each gas nozzle having a spray hole and configured to discharge ionized gas, and a pair of first and second guiding plates disposed on opposite sides of the plurality of gas nozzles and extending downward from first and second sides of the body opposite to each other. While the substrate is in the substrate transfer chamber, the method may additionally include ionizing the gas with the ionizer, and discharging the ionized gas from the plurality of gas nozzles toward the substrate, wherein the first and second guiding plates guide the ions sprayed from the spray holes to be directed toward the substrate. The method may additionally include, after the substrate is transferred from the transfer chamber to the process chamber, performing a fabrication process on the substrate.

In one embodiment, the fabrication process is a chemical vapor deposition process, an etching process, or a measuring process.

In one embodiment, the ionizer further includes a gas supply chamber, and the method further includes receiving gas from outside the ionizer to the gas supply chamber, and supplying the gas from the gas supply chamber to the plurality of gas nozzles prior to ionizing the gas and discharging the ionized gas from the plurality of gas nozzles.

In one embodiment, each gas nozzle includes an electrode needle disposed within the respective spray hole, the electrode needle generating a corona discharge that ionizes the gas.

In one embodiment, the plurality gas nozzles are arranged along with the first and second guiding plates in a longitudinal direction of the body.

In one embodiment, the longitudinal length of the body is at least substantially the same as a diameter of the substrate.

In one embodiment, a length of each of the first and second guiding plates protruding from a bottom surface of the body is at least half of a distance between the substrate and the body.

In one embodiment, the method additionally includes prior to transferring the substrate to the process chamber, aligning the substrate with a substrate aligner positioned within the substrate transfer chamber and having the ionizer positioned thereabove, and while performing the aligning, performing the ionizing of the gas.

In example embodiments, the gas comprises a nitrogen gas.

BRIEF DESCRIPTION OF THE DRAWINGS

Example embodiments will be more clearly understood from the following detailed description taken in conjunction with the accompanying drawings.

FIG. 1 is a perspective view illustrating an ionizer in accordance with example embodiments.

FIG. 2 is an exploded perspective view illustrating the ionizer in FIG. 1, according to example embodiments.

FIG. 3 is a side view illustrating the ionizer in FIG. 1, according to example embodiments.

FIG. 4 is a bottom view illustrating an ion spraying cap of the ionizer in FIG. 1, according to example embodiments.

FIG. 5 is a block diagram illustrating internal elements of the ionizer in FIG. 1, according to example embodiments.

FIG. 6 is a cross-sectional view illustrating the ionizer in FIG. 1, according to example embodiments.

FIG. 7 is a cross-sectional view illustrating the detachable ion spraying cap in FIG. 6, according to example embodiments.

FIG. 8 is a side view illustrating an ionizer in accordance with example embodiments.

FIG. 9 is a plan view illustrating a substrate transfer system in accordance with example embodiments.

FIG. 10 is a cross-sectional view illustrating the substrate transfer system in FIG. 9, according to example embodiments.

FIG. 11 is a plan view illustrating an ionizer installed on a substrate aligner in FIG. 9, according to example embodiments.

FIG. 12 is a side view illustrating the ionizer in FIG. 11, according to example embodiments.

FIG. 13 is a flow chart illustrating an exemplary method of manufacturing a semiconductor device using an ionizer, according to example embodiments.

DETAILED DESCRIPTION OF EXAMPLE EMBODIMENTS

Figure 1:
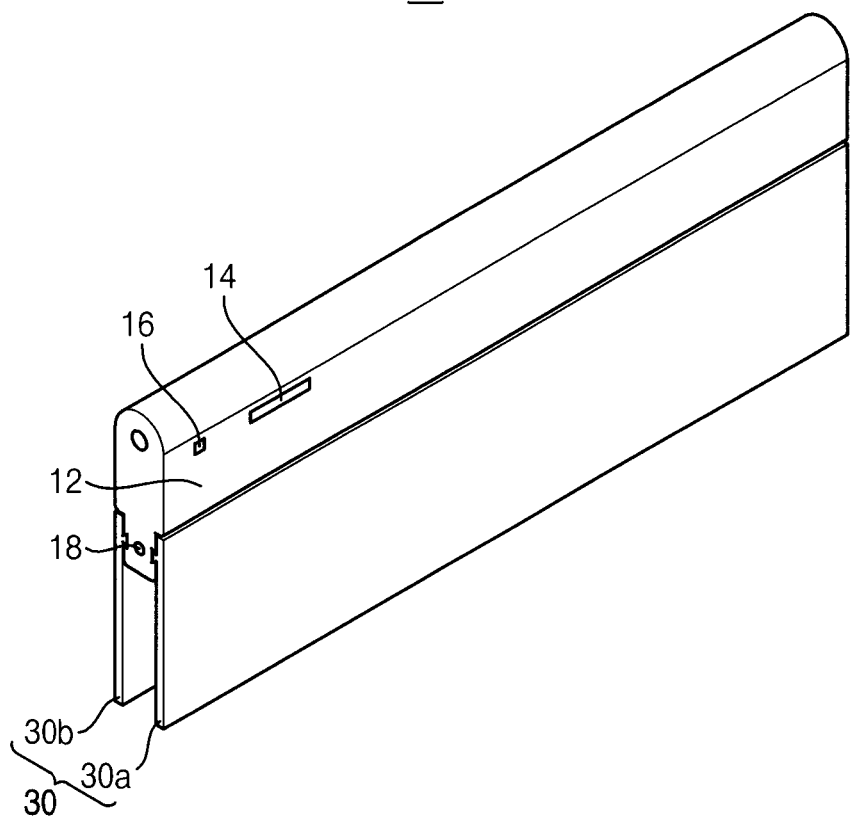
FIGS. 1 to 13 represent non-limiting, example embodiments as described herein.

Various example embodiments will be described more fully hereinafter with reference to the accompanying drawings, in which example embodiments are shown. Example embodiments may, however, be embodied in many different forms and should not be construed as limited to example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, or as "contacting" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section, for example as a naming convention. Thus, a first element, component, region, layer or section discussed below could be termed a second element, component, region, layer or section without departing from the teachings of example embodiments. For example, a component or step named as a first component or step in one section of the specification, may be referred to as a second component or step in another section of the specification or in the claims. Similarly, a component or step labeled as a first or second component or step in a claim may not have been described in the specification using such a label.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of example embodiments.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
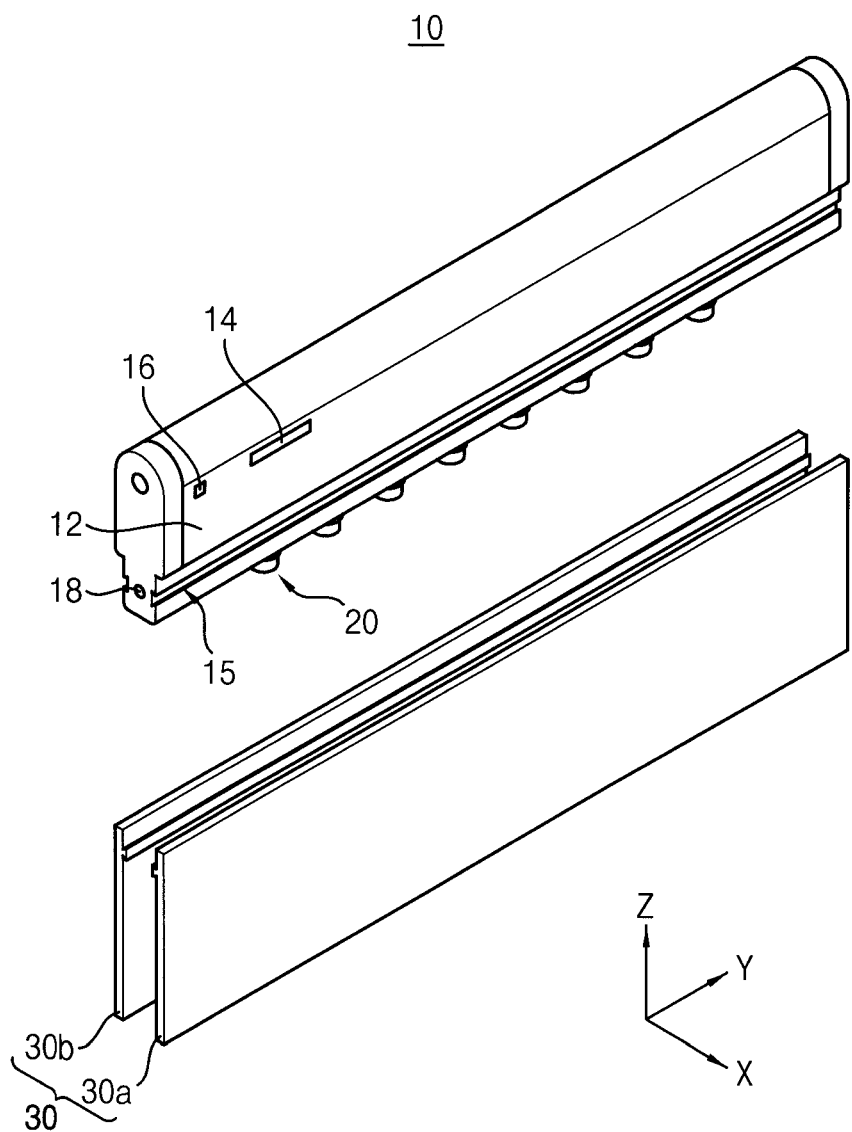
Figure 3:
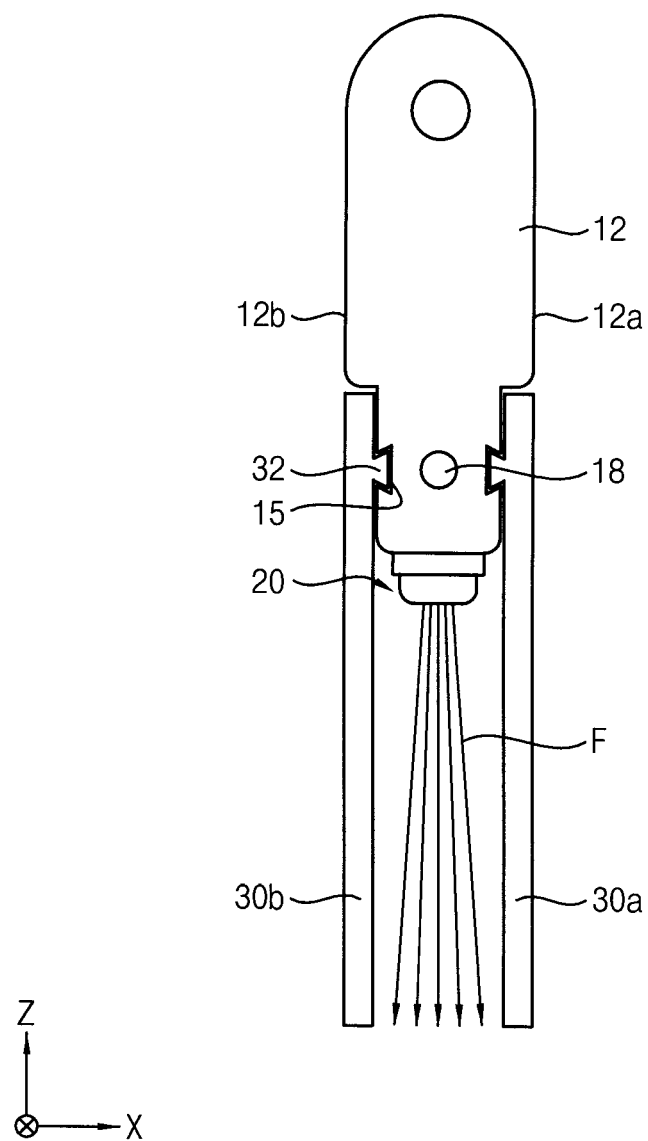
Figure 4:
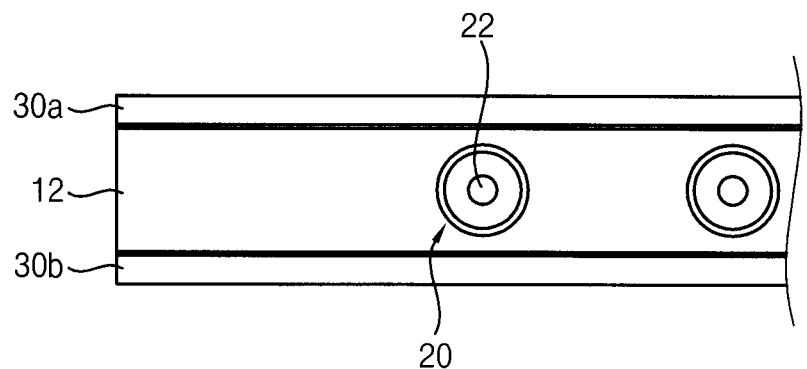
Figure 5:
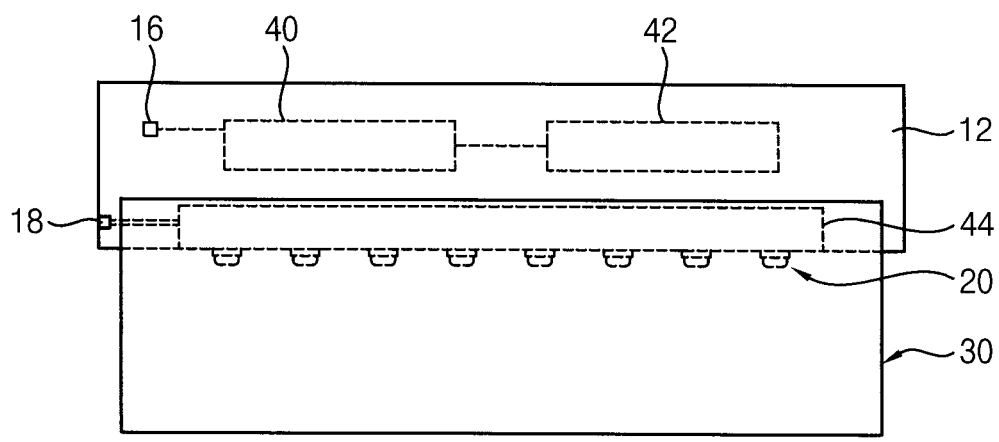
Figure 6:
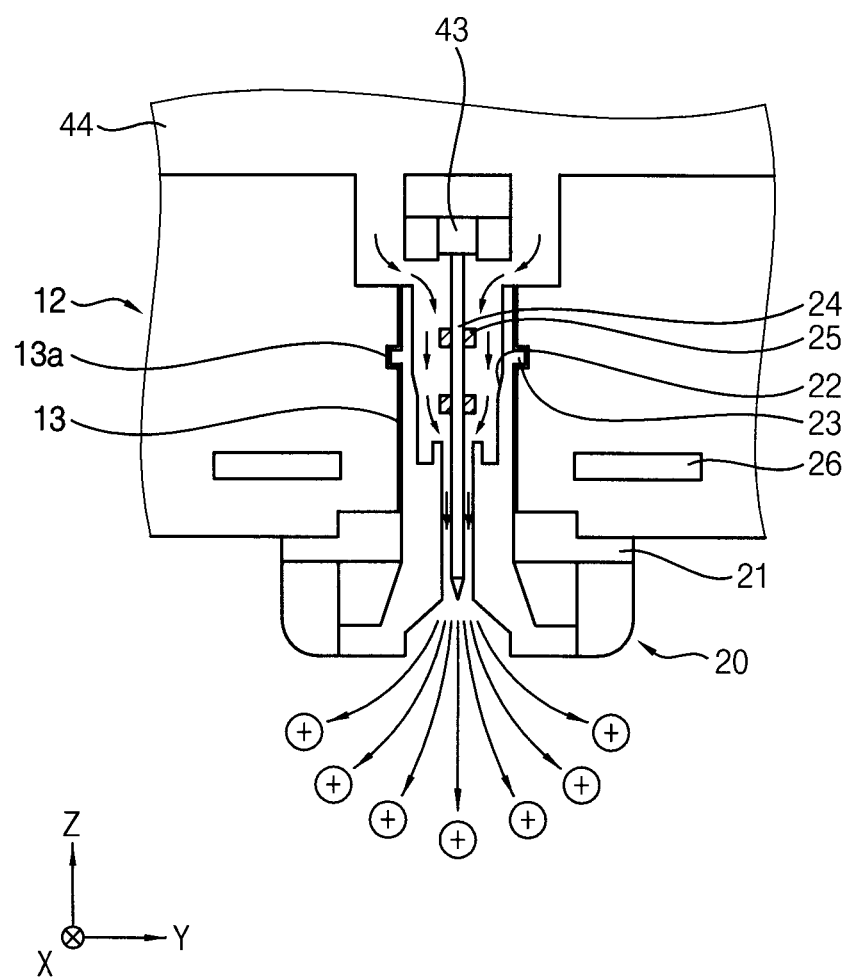
Figure 7:
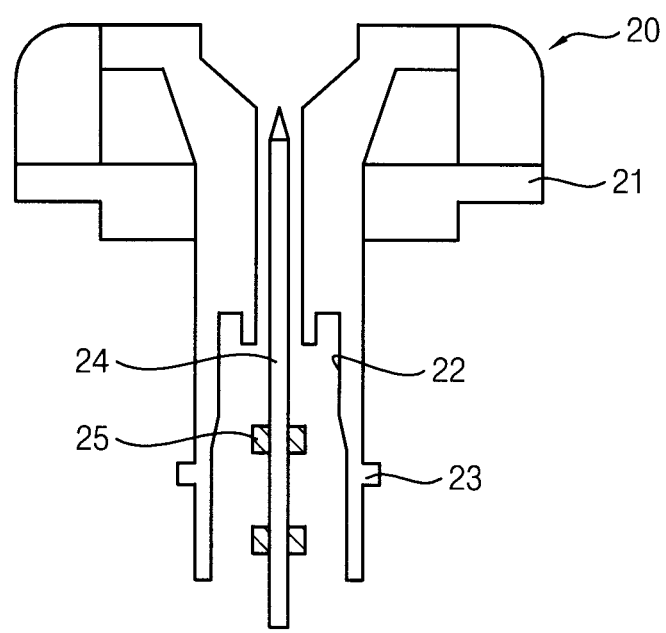

FIG. 1 is a perspective view illustrating an ionizer in accordance with example embodiments. FIG. 2 is an exploded perspective view illustrating the ionizer in FIG. 1. FIG. 3 is a side view illustrating the ionizer in FIG. 1. FIG. 4 is a bottom view illustrating an ion spraying cap of the ionizer in FIG. 1. FIG. 5 is a block diagram illustrating internal elements of the ionizer in FIG. 1. FIG. 6 is a cross-sectional view illustrating the ionizer in FIG. 1. FIG. 7 is a cross-sectional view illustrating the detachable ion spraying cap in FIG. 6.

Referring to FIGS. 1 to 7, an ionizer 10 may include a body 12 extending in a direction, an ion spraying cap 20 installed in a lower portion of the body 12 and configured to spray an ionic air, and a guiding plate 30 surrounding the ion spraying cap 20 to guide the ionic air sprayed from the ion spraying cap 20. The ion spraying cap 20 may be one of a plurality of ion spraying caps installed in the lower portion of the body 12, as shown in the various figures. The guiding plate 30 may surround opposite sides of the plurality of ion spraying caps 20. For example, the ion spraying caps 20 may be disposed along a particular direction (e.g. Y direction) and the guiding plate 30 may be disposed to surround the ion spraying caps 20 in a second direction, for example perpendicular to the particular direction (e.g. X direction).

In example embodiments, a housing of the body 12 may include and/or receive a controller 40, a voltage generator 42, a gas supply 44, high voltage wirings, ground plate wirings, gas lines, etc, as described later. The body 12 may have a bar shape extending in first direction (e.g., Y direction). The body 12 may have a first side (e.g., 12a) and a second side (e.g., 12b) in YZ plane opposite to each other.

As illustrated in FIG. 1, a display part 14 and a connection part 16 may be installed in the first side 12a. The display part 14 may include, for example, light emitting diodes (LEDs) (not illustrated) for representing operating states of the ionizer 10. The display part 14 may display a polarity of a target ion, an amount of the target ions, etc. The connection part 16 may be connected, for example, to an external power supply via a cable. An air port 18, more generally referred to as a gas port, may be installed in an end portion or both end portions of the body 12, and the air port 18 may be connected to a gas supply, such as an external air or gas supply source.

As illustrated in FIG. 5, the controller 40, the voltage generator 42 and the gas supply 44 may be installed in the body 12. The controller 40 may include a power circuit, a display circuit, a control circuit, etc. The controller 40 may be connected to the connection part 16 to be supplied with power from the external power supply. The voltage generator 42 may be supplied power from the controller 40. The voltage generator 42 may generate an AC voltage, for example, of several kilovolts (kV) or more. A ground electrode 26 (see FIG. 6) may be connected to the controller 40 by the ground plate wiring.

The gas supply 44 may be installed within a lower portion of the housing. The gas supply 44 may be in fluid communication with the air port 18 by the gas lines. For example, the gas supply source may supply a nitrogen gas and/or an air of high purity to the gas supply 44 through the air port 18. More specifically, the gas supply 44 shown in FIG. 5 may be referred to as a gas supply chamber.

In example embodiments, the ion spraying cap 20 may be installed in the lower portion of the body 12. A plurality of the ion spraying caps 20 may be arranged to be spaced apart from each other in Y direction. The number of the caps and the spacing distance may be determined in consideration of a target neutralization distance, a charge amount, etc. The ion spraying cap 20 may be in fluid communication with the gas supply 44 to serve as a sheath gas nozzle for spraying the gas supplied from the gas supply 44.

As illustrated in FIGS. 6 and 7, the cap 20 may be detachably installed in the lower portion of the body 12. An end portion of the cap 20 may be inserted into a receiving portion 13 of the body 12. Another end portion of the cap 20 (e.g., an opposite end portion) may protrude from a bottom surface of the body 12. A fixing recess 13a may be formed in an inner surface of the receiving portion 13, and a fixing protrusion 23 of the end portion of the cap 20 may be combined with the fixing recess 13a by interference fit. Alternatively, the end portion of the cap 20 may be combined with the receiving portion 13 by a screw joining method or other joining method.

The cap 20 may include a spray hole 22 for spraying a gas and an electrode needle 24 disposed within the spray hole 22 and configured to generate a corona discharge. The electrode needle 24 may be supported within the spray hole 22 by a fixing member 25. The electrode needle 24 may include, for example, silicon or tungsten.

When the cap 20 is inserted into the receiving portion 13 of the body 12, the spray hole 22 may be in fluid communication with the gas supply 44 such that the gas supplied from the gas supply 44 may be sprayed to the outside through the spray hole 22. The gas may flow through the spray hole 22 to form a gas sheath layer surrounding a distal portion of the electrode needle 24.

In one embodiment, when the cap is inserted into the receiving portion 13 of the body 12, the electrode needle 24 makes contact with a conductive connection member 43 to be electrically connected to the voltage generator 42. In this case, the distal portion of the electrode needle 24 may be positioned to protrude from the bottom surface of the body 12.

An AC voltage of several kilovolts (kV) or more may be applied to the electrode needle 24 by the voltage generator 42, and thus, a corona discharge may be generated around the distal portion of the electrode needle 24. For example, an AC pulse voltage of 6 kV or 7 kV may be applied to the electrode needle 24. Accordingly, an air flowing through the spray hole 22 may be ionized by the corona discharge and then the ionized air may be sprayed to the outside from the spray hole 22.

In example embodiments, a guiding plate 30 may include a pair of first and second guiding plates 30a and 30b which are disposed with the ion spraying cap 20 being interposed between the first and second guiding plates 30a and 30b. For example, a plurality of ion spraying caps 20 may be interposed between the two guiding plates. The first and second guiding plates 30a and 30b may extend downward from the lower portion of the body 12 respectively. The first and second guiding plates 30a and 30b may include, for example, a non-electrostatic insulating material. For example, the guiding plate may include a polymer material such as PVC. The guiding plate 30 and first and second guiding plates 30a and 30b may generally be referred to as a guide, or guide component, including first and second guide parts or portions, for example including portions that extend beyond a bottom of the ionizer body 12. Further, though various embodiments describe first and second guiding plates 30a and 30b as separate components, the plates are not limited as such. For example, a one-piece guiding plate 30 can be used, that has two side plate portions connected by one or two end portions (e.g., a portion connecting the two side portions).

As illustrated in FIGS. 2 and 3, fixing groove 15 may be formed in the first and second sides 12a and 12b of the body 12 respectively. The fixing groove 15 may extend in Y direction. The first and second plates 30a and 30b may have a protrusion 32 corresponding to the fixing groove 15. In one embodiment, the protrusion 32 of the first guiding plate 30a may be slidably fitted into the fixing groove 15 of the first side 12a of the body 12 by a sliding fitting method, and the protrusion 32 of the second guiding plate 30b may be slidably fitted into the fixing groove 15 of the second side 12b of the body 12 by a sliding fitting method.

The first guiding plate 30a may extend downward from the first side 12a of the body 12. The second guiding plate 30b may extend downward from the second side 12b of the body 12. In one embodiment, the first and second guiding plates 30a and 30b may be parallel with each other in YZ plane.

For example, a length of each of the first and second guiding plates 30a and 30b from the bottom surface of the body 12 may be at least half of a target antistatic distance, that is, an operating distance. In certain embodiments, the target antistatic distance D may be defined as a distance between a bottom of the ionizer body 12 and a wafer W (See FIG. 12). For example, the distance between the body 12 and the wafer may be preset to about 60 mm, about 65 mm, etc. The length of the first and second guiding plates 30a and 30b from the bottom surface of the body 12 also may be at least half of the distance between the body and the substrate. The length and shape of the guiding plate 30a, 30b may be determined in consideration of the target antistatic distance, the amount of the target ions, etc.

Accordingly, the first and second guiding plates 30a and 30b may be disposed at both sides of the ion spraying cap 20 (e.g., at both sides in an X direction) serving as a sheath gas nozzle such that a flow (F) of the ionized air spraying from the spray hole 22 of the cap 20 is focused, for example, in a downward direction. Thus, the first and second guiding plates 30a and 30b may minimize losses of ions due to the internal ground electrode 26 and an external air current.

As mentioned above, the AC type ionizer 10 may include a pair of the first and second guiding plates installed externally on the housing. The first and second guiding plates may be disposed with the ion spraying caps 20 interposed between the first and second guiding plates and may extend downward from the lower portion of the housing respectively to guide the ionized air sprayed from the cap to the target. The first and second guiding plates may be first and second guide parts, each extending from a side of the body 12 and covering part of the side of the body 12, and extending past a bottom of the body where one or more spraying caps 20 are disposed to extend a particular distance beyond the bottom of the body. In one embodiment, the extending distance beyond the bottom of the body is longer than the distance in the same direction that covers a part of the side of the body 12.

Accordingly, the pair of the first and second guiding plates may prevent losses of ions generated from the ion spraying cap 20 due to the adjacent ground electrode 26, the external air current, the antistatic distance, etc., before reaching the target.

Figure 8:
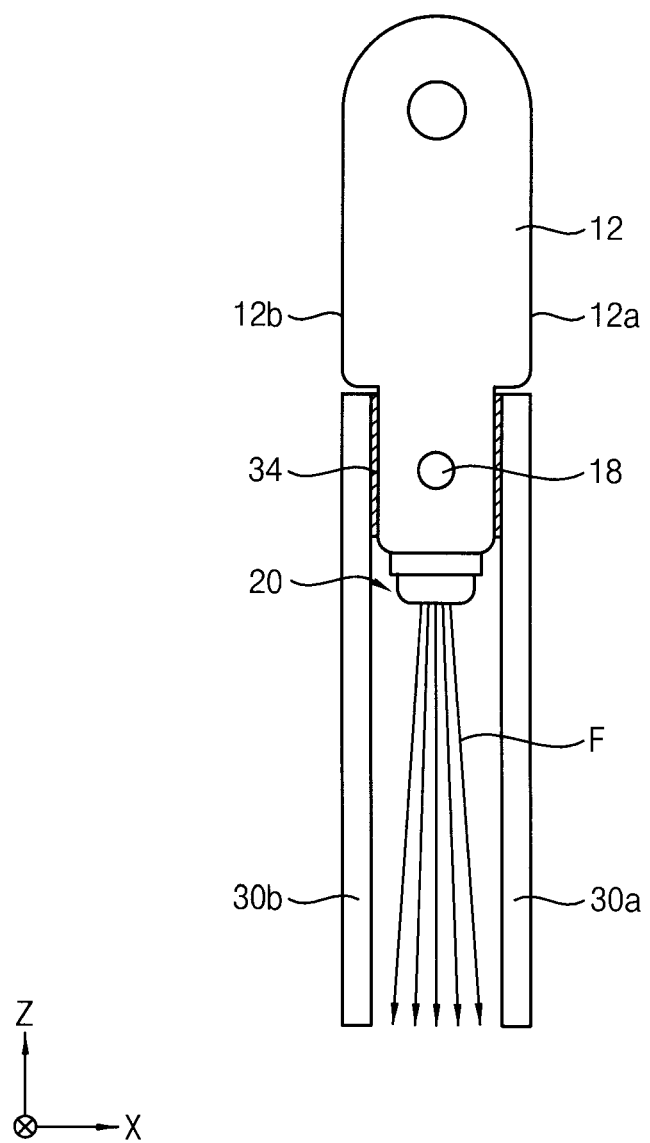

FIG. 8 is a side view illustrating an ionizer in accordance with example embodiments. The ionizer is substantially the same as the ionizer described with reference to FIGS. 1 to 7, except an adhesive member of a guiding plate. Thus, the same or like reference numerals will be used to refer to as the same or like elements and any repetitive explanation concerning the above elements will be omitted.

Referring to FIG. 8, first and second guiding plates 30a and 30b may be adhered to first and second sides 12a and 12b of a body 12 opposite to each other by an adhesive tape 34 respectively. For example, the adhesive tape 34 may have a uniform width and extend in Y direction. For example, the adhesive tape 34 may include an adhesive material such as epoxy, polyimide, etc.

Accordingly, the first and second guiding plates 30a and 30b may be easily adhered to the body 12 using an adhesive member such as the adhesive tape 34. The first and second guiding plates 30a and 30b may be affixed to the body 12 using other means as well, such as, for example, one or more screws, snaps, etc. As such, different types of connectors may be used to affix the first and second guiding plates 30a and 30b to the body 12. In certain of these embodiments, these guiding plates 30a and 30b may be separately attached to the body 20, as opposed to being integrated with the body, and may be removably attached to the body 20.

Hereinafter, an exemplary substrate transfer system having the ionizer of FIG. 1 installed therein will be explained in detail.

Figure 9:
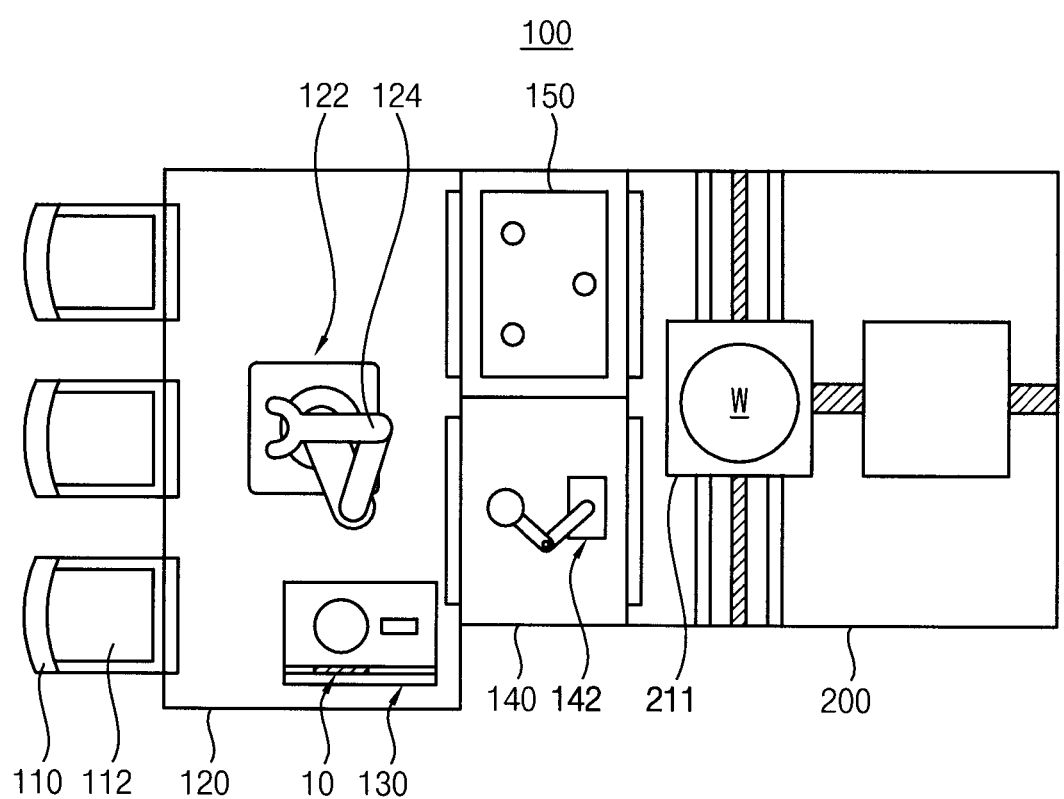
Figure 10:
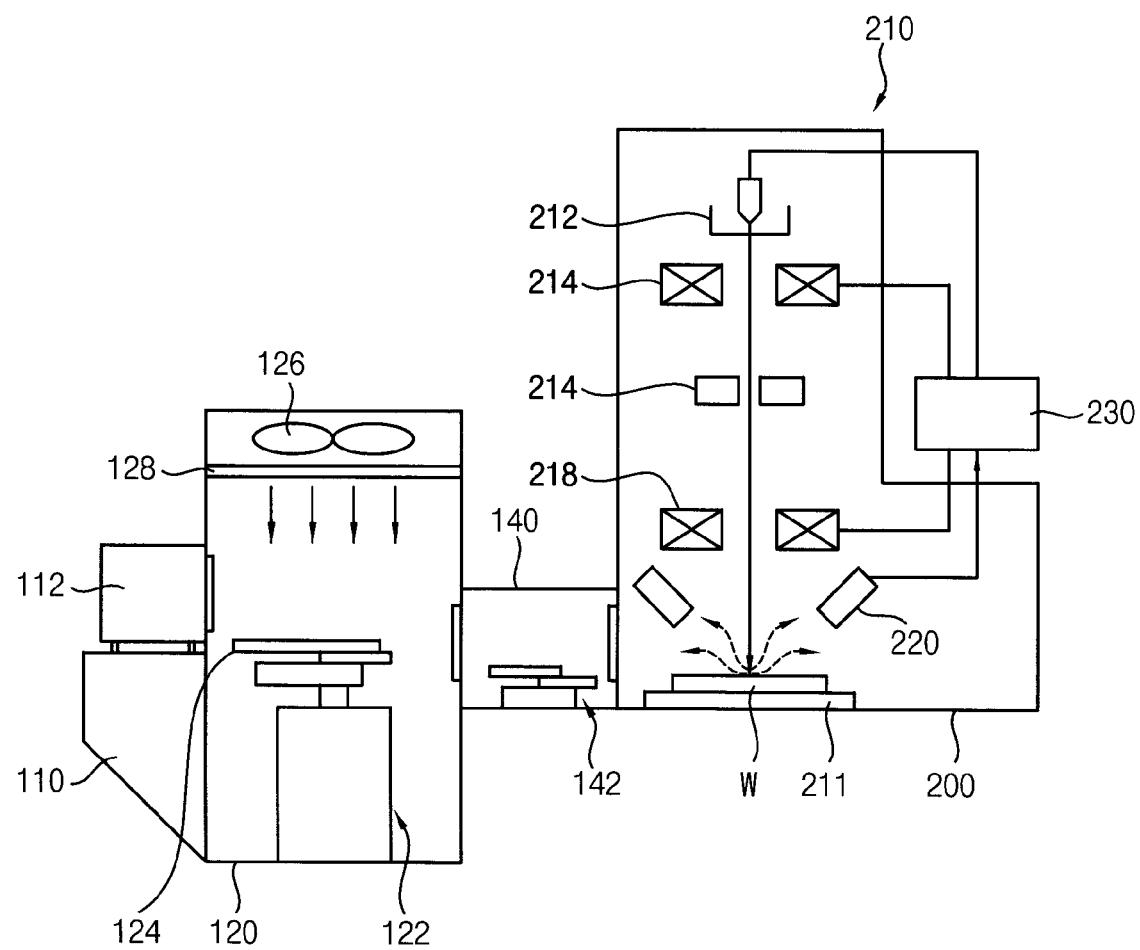
Figure 11:
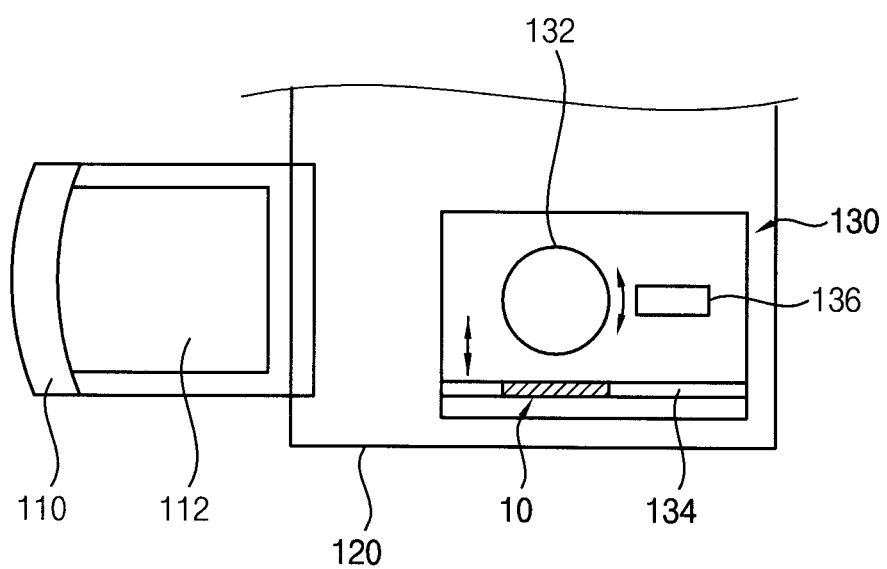
Figure 12:
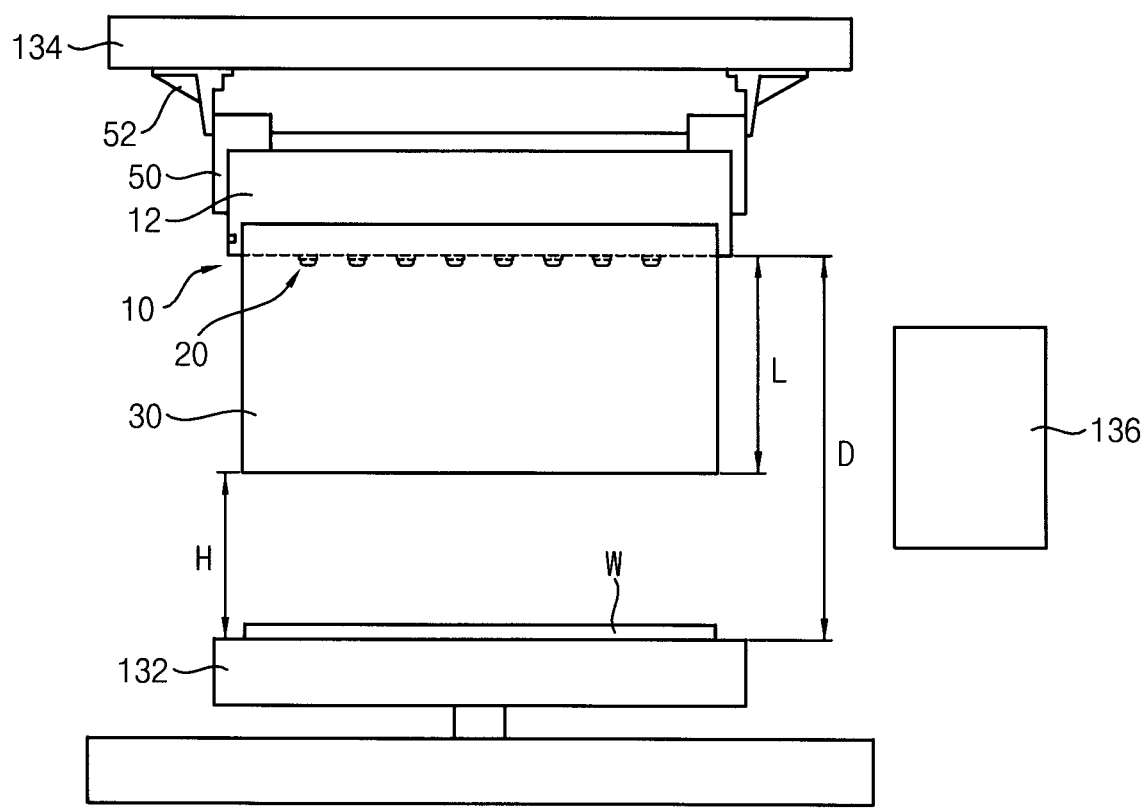

FIG. 9 is a plan view illustrating a substrate transfer system in accordance with example embodiments. FIG. 10 is a cross-sectional view illustrating the substrate transfer system in FIG. 9. FIG. 11 is a plan view illustrating an ionizer installed on a substrate aligner in FIG. 9. FIG. 12 is a side view illustrating the ionizer in FIG. 11.

Referring to FIGS. 9 to 12, a substrate transfer system 100 may include a substrate transfer chamber 120 disposed between a substrate receiving portion 110 and a process chamber 200 and having a transfer mechanism for transferring a substrate therebetween, and an ionizer 10 disposed within the substrate transfer chamber 120 and configured to eliminate or reduce static electricity of the substrate. The substrate may include a semiconductor wafer (W), a display panel substrate, etc. For example, the substrate may be used for forming a plurality of electronic devices arranged in array form, such as a plurality of semiconductor devices. In certain embodiments, each semiconductor device may include an integrated circuit, and may form a semiconductor chip.

As used herein, a semiconductor device may refer, for example, to a device that includes an integrated circuit on a die, such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include, for example, memory devices such as volatile or non-volatile memory devices, display panel substrates, or microprocessor devices.

An electronic device, as used herein, may refer to one of these semiconductor devices, but may additionally include products that include these devices, such as a memory module, memory card, display panel, hard drive including additional components, or a mobile phone, laptop, tablet, desktop, camera, or other consumer electronic device, etc.

In example embodiments, the substrate transfer system 100 may serve as equipment front end module (EFEM) which is disposed in front of process equipment to transfer wafers from a front open unified pod (FOUP) to the process equipment. The process equipment may include, for example, a process chamber 200 for performing a desired semiconductor process. For example, the process chamber 200 may perform a chemical vapor deposition process, an etching process, a measuring process, etc. As a result of the semiconductor process, a semiconductor device may be formed. A further description of an exemplary manufacturing process is described below.

As illustrated in FIGS. 10 and 11, the substrate receiving portion 110 may be positioned in a first side of the substrate transfer chamber 120. A wafer container (FOUP) 112 having wafers therein may be disposed on the substrate receiving portion 110. The wafer container 112 may be transferred onto the substrate receiving portion 110 by a transfer device such as overhead hoist transport (OHT).

The substrate transfer system 100 may include a transfer mechanism 122 which transfers wafers between the wafer container 112 and the process chamber 200. The transfer mechanism 122, also described as a transfer device 122, may include a transfer arm 124 for gripping and transferring the wafer W from the wafer container 112.

In example embodiments, the substrate transfer system 100 may further include a fan filter unit for controlling a pressure and cleanliness of the substrate transfer chamber 120. The fan filter unit may include a blower fan 126 installed in an upper wall of the substrate transfer chamber 120 to blow an air downward and a filter 128 disposed under the blower fan 126 to filter contaminants out of the air. The substrate transfer chamber 120 with the fan filter unit may serve as a clean room having a desired cleanliness.

The process chamber 200 may be positioned in a second side of the substrate transfer chamber 120 opposite to the first side. The substrate transfer system 100 may further include a load lock chamber 140 and a holder 150 between the substrate transfer chamber 120 and the process chamber 200. Accordingly, the wafer W in the wafer container 112 may be loaded into the process chamber 200 through the substrate transfer chamber 120 and the load lock chamber 140, and the wafer W in the process chamber 200 may be unloaded to the substrate receiving portion 110 through the holder 150 and the substrate transfer chamber 120.

As illustrated in FIG. 10, the process chamber 200 may be a measuring chamber for performing a measuring process. The process chamber 200 may include scanning electron microscope (SEM) for imaging the wafer W. A SEM image obtained by SEM may be used to measure a line width of a pattern formed on the wafer W.

In particular, the scanning electron microscope may include a stage 211 for supporting a sample W, an electron gun 212 for generating primary electron beam, an electron beam column having focusing lenses 214, a deflector 215 and an objective lens 216 for controlling a direction and a width of the primary electron beam and irradiating the electron beam onto the sample W, and a detector 220 for detecting electrons emitting from the sample W.

For example, the wafer may refer to a substrate formed of a semiconductor or non-semiconductor material. The wafer may include one or more layers formed on the substrate. For example, such layers may include, but may not be limited to, a resist, a dielectric material or a conductive material.

The detected electrons may be used to obtain a SEM image of the wafer W. The SEM image be analyzed to measure the line width and the like of the pattern formed on the wafer W.

In example embodiments, the substrate transfer system 100 may include a substrate aligner 130. The substrate aligner 130 may be positioned within the substrate transfer chamber 120 and align the wafer W prior to transferring to the process chamber 200. The ionizer 10 in FIG. 1 may be positioned over the substrate aligner 130 to eliminate static electricity of the wafer W on the substrate aligner 130. Alternatively, the ionizer 10 in FIG. 1 may be positioned over the transfer arm 124 of the transfer mechanism 122 to eliminate static electricity of the wafer W gripped by the transfer arm 124.

As illustrated in FIGS. 11 and 12, the substrate aligner 130 may be disposed adjacent to a sidewall of the substrate transfer chamber 120. When the wafer W is transferred on an aligning stage 132 of the substrate aligner 130 from the wafer container 112 by the transfer mechanism 122, an aligning sensor 136 may detect a notch of the wafer W and the aligning stage 132 may rotate based on the detected information to align the wafer W.

The ionizer 10 may have a bar shape extending in a direction. In one embodiment, a longitudinal length of the ionizer 10 may be substantially the same as or greater than a diameter of the wafer.

A supporting member 134 may be provided over the aligning stage 132 to install the ionizer 10 over the aligning stage 132. The supporting member 134 may be movable across the aligning stage 132. Accordingly, the ionizer 10 may move relative to the wafer on the aligning stage 132 to eliminate static electricity of the wafer.

Alternatively, the supporting member 134 may be installed stationary over the aligning stage 132 to extend across the wafer on the aligning stage 132. In this case, as the aligning stage 132 rotates, the stationary ionizer 10 may spray ionized air to the entire surface of the wafer, thereby eliminating static electricity of the wafer.

The ionizer 10 may be installed in the supporting member 134 by a fixing bracket 50, 52. The fixing bracket may include a first bracket 50 and a second bracket 52 connected to each other. The first brackets 50 may be fixed to both end portions of the ionizer 10 respectively, and the second brackets 52 may be fixed to a lower portion of the supporting member 134. Accordingly, the ionizer 10 may be fixed to the supporting member 134 by the first and second brackets 50 and 52.

A length of the guiding plate 30 of the ionizer 10 may be determined in consideration of an antistatic distance for the wafer W. For example, the length L of the guiding plate 30 protruding from the bottom surface of the body 12 may be at least half of a target antistatic distance D, for example, a distance between a bottom of the ionizer body 12 and the wafer W.

As mentioned above, the ionizer 10 may be installed within the substrate transfer chamber 120 where air flows downward by the blower fan 126, and the ionizer 10 may include a pair of guiding plates 30 disposed in both sides of a spray nozzle to guide an ionized air sprayed from the spray nozzle to be directed to the wafer. The pair of the guiding plates may prevent losses of ions generated from the ionizer 10 due to the ground electrode, the external air current, the antistatic distance, etc., before reaching the wafer, thereby providing an improved antistatic efficiency.

Figure 13:
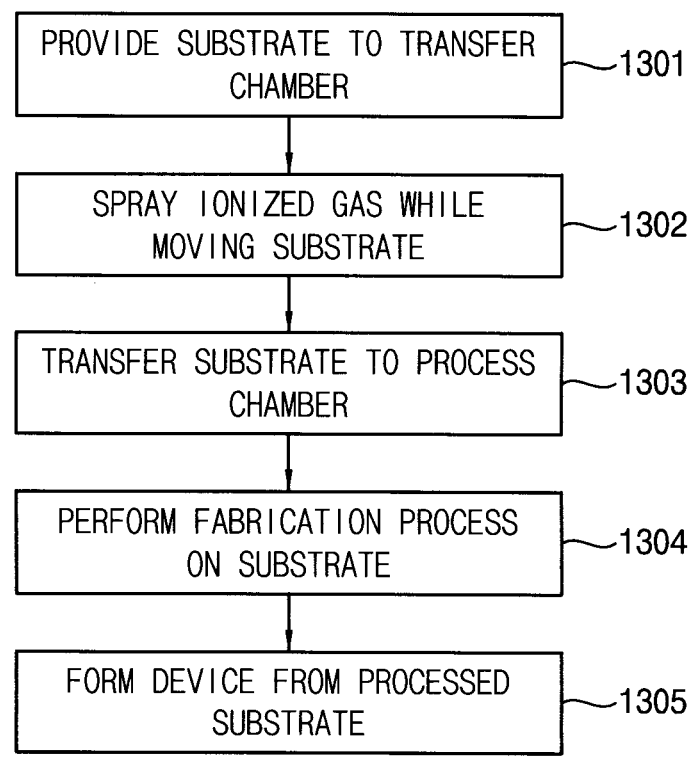

FIG. 13 is a flow chart depicting an exemplary method of manufacturing a semiconductor device, according to certain embodiments.

In step 1301, a substrate is provided to a transfer chamber. For example, a substrate may be provided to transfer chamber (e.g. 120) by placing a wafer container (e.g., 112) in a substrate receiving portion (e.g., 110) of the transfer chamber.

Next, in step 1302, ionized gas may be sprayed while the substrate is moved in the transfer chamber. For example, a transfer arm (e.g., 124) of a transfer mechanism (e.g., 122) may transfer the substrate within the transfer chamber onto a substrate aligner (e.g., 130), and while the substrate is being aligned using the substrate aligner, ionized gas may be sprayed in the transfer chamber toward the substrate using, for example, an ionizer such as described in one of FIGS. 1-8, that sprays ionized gas in the manners described in connection with these figures.

Next, in step 1303, the substrate may be transferred to a process chamber (e.g., 200). In certain embodiments, this is accomplished through a load lock chamber (e.g., 140).

In step 1304, a fabrication process is performed on the substrate. For example, the fabrication process may include a semiconductor process such as a chemical vapor deposition process, an etching process, or a measuring process.

In step 1305, the processed substrate is formed into a device. For example, the processed substrate may form or may be used to form an integrated circuit device including an integrated circuit on the substrate. In one embodiment, a plurality of integrated circuits are formed on the substrate to form a plurality of semiconductor chips, and the semiconductor chips are singulated from each other to form separate semiconductor devices. The semiconductor chips may be included in a package (e.g., by being mounted on a package substrate and covered with an encapsulant) or module (e.g., by being mounted on a module board), for example, and may thus form an electronic device.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method including:
   providing a substrate to a transfer chamber of a transfer apparatus;
   moving the substrate in the transfer chamber;
   while moving the substrate in the transfer chamber, spraying ionized gas toward the substrate using an ionizer, the ionizer including:
   a body having a gas supply chamber for supplying gas,
   an ion spraying cap installed in a lower portion of the body and having a spray hole in fluid communication with the gas supply to spray a gas supplied from the gas supply to the outside of the ionizer and an electrode needle disposed within the spray hole to generate a corona discharge and generate ionized gas, and
   a pair of first and second guiding plate portions disposed on opposite sides of the ion spraying cap and extending downward from the lower portion of the body respectively to guide the ionized gas sprayed from the spray hole to be directed toward the substrate;

transferring the substrate to a process chamber;
performing a fabrication process on the substrate while it is in the process chamber; and
forming a semiconductor device from the processed substrate.

2. The method of claim 1, wherein the fabrication process is a chemical vapor deposition process, an etching process, or a measuring process, and wherein forming the semiconductor device includes forming a semiconductor chip including an integrated circuit on a die.

3. The method of claim 1, wherein the body extends in a first direction and a plurality of the ion spraying caps are arranged to be spaced apart from each other in the first direction.

4. The method of claim 1, wherein a distal portion of the electrode needle is positioned to protrude from a bottom surface of the body.

5. The method of claim 1, wherein fixing grooves are formed in first and second sides of the body opposite to each other respectively, and each of the first and second guiding plate portions has a protrusion which is slidably fitted into the corresponding fixing groove by a sliding fitting method.

6. The method of claim 1, wherein the first and second guiding plate portions are adhered to first and second sides of the body opposite to each other by an adhesive tape respectively.

7. The method of claim 1, wherein the first and second guiding plate portions comprise a non-electrostatic insulating material.

8. The method of claim 1, wherein a length of each of the first and second guiding plate portions protruding from a bottom surface of the body is at least half of a target antistatic distance.

9. The method of claim 1, wherein the first and second guiding plate portions are arranged to be parallel with each other.

10. The method of claim 1, wherein the electrode needle comprises silicon or tungsten.

11. The method of claim 1, wherein the gas comprises a nitrogen gas.

12. The method of claim 1, wherein the ion spraying cap is detachably installed in a lower portion of the body.

13. A method, comprising:
transferring a substrate from a substrate transfer chamber to a process chamber, the transfer chamber having a transfer device that transfers the substrate;
while the substrate is in the substrate transfer chamber:
supplying gas to an ionizer disposed within the substrate transfer chamber, wherein the ionizer includes:
a body installed over the substrate,
a plurality of gas nozzles installed in a lower portion of the body and arranged in a first direction, each gas nozzle having a spray hole and configured to discharge ionized gas, and
a pair of first and second guiding plates disposed on opposite sides of the plurality of gas nozzles and extending downward from first and second sides of the body opposite to each other; and
ionizing the gas with the ionizer, and discharging the ionized gas from the plurality of gas nozzles toward the substrate,
wherein the first and second guiding plates guide the ions sprayed from the spray holes to be directed toward the substrate; and
after the substrate is transferred from the transfer chamber to the process chamber, performing a fabrication process on the substrate.

14. The method of claim 13, wherein the fabrication process is a chemical vapor deposition process, an etching process, or a measuring process.

15. The method of claim 13, wherein the ionizer further includes a gas supply chamber, and further comprising:
receiving gas from outside the ionizer to the gas supply chamber; and
supplying the gas from the gas supply chamber to the plurality of gas nozzles prior to ionizing the gas and discharging the ionized gas from the plurality of gas nozzles.

16. The method of claim 13, wherein each gas nozzle includes an electrode needle disposed within the respective spray hole, the electrode needle generating a corona discharge that ionizes the gas.

17. The method of claim 13, wherein the plurality gas nozzles are arranged along with the first and second guiding plates in a longitudinal direction of the body.

18. The method of claim 17, wherein the longitudinal length of the body is at least substantially the same as a diameter of the substrate.

19. The method of claim 13, wherein a length of each of the first and second guiding plates protruding from a bottom surface of the body is at least half of a distance between the substrate and the body.

20. The method of claim 13, further comprising a substrate aligner positioned within the substrate transfer chamber, wherein the ionizer is positioned over the substrate aligner, and further comprising:
aligning the substrate with the substrate aligner prior to transferring the substrate to the process chamber; and
while performing the aligning, performing the ionizing of the gas.

* * * * *